(12) United States Patent
Redaelli et al.

(10) Patent No.: US 9,748,480 B2
(45) Date of Patent: *Aug. 29, 2017

(54) SEMICONDUCTOR CONSTRUCTIONS AND MEMORY ARRAYS

(71) Applicant: Micron Technology, Inc., Boise, ID (US)

(72) Inventors: Andrea Redaelli, Casatenovo (IT); Cinzia Perrone, Bellusco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/287,609

(22) Filed: Oct. 6, 2016

(65) Prior Publication Data

US 2017/0025606 A1    Jan. 26, 2017

Related U.S. Application Data

(60) Continuation of application No. 14/323,922, filed on Jul. 3, 2014, now Pat. No. 9,490,425, which is a division of application No. 13/482,672, filed on May 29, 2012, now Pat. No. 8,803,118.

(51) Int. Cl.

| | |
|---|---|
| *H01L 29/792* | (2006.01) |
| *H01L 45/00* | (2006.01) |
| *H01L 23/525* | (2006.01) |
| *H01L 27/24* | (2006.01) |
| *H01L 23/48* | (2006.01) |

(52) U.S. Cl.
CPC .......... *H01L 45/141* (2013.01); *H01L 23/481* (2013.01); *H01L 23/5256* (2013.01); *H01L 27/2463* (2013.01); *H01L 27/2472* (2013.01); *H01L 27/2481* (2013.01); *H01L 45/06* (2013.01); *H01L 45/122* (2013.01); *H01L 45/126* (2013.01); *H01L 45/1253* (2013.01); *H01L 45/144* (2013.01); *H01L 2924/0002* (2013.01)

(58) Field of Classification Search
CPC ......... H01L 27/11521; H01L 27/11568; H01L 27/11556; H01L 29/7831
See application file for complete search history.

(56) References Cited

U.S. PATENT DOCUMENTS

| | | | |
|---|---|---|---|
| 7,973,302 | B2 | 7/2011 | Kim et al. |
| 8,420,171 | B2 | 4/2013 | Lazzari et al. |
| 8,680,499 | B2 | 3/2014 | Erbetta et al. |
| 8,994,489 | B2 | 3/2015 | Redaelli et al. |
| 9,490,425 | B2 * | 11/2016 | Redaelli .............. H01L 23/5256 |
| 2006/0091492 | A1 | 5/2006 | Lee et al. |
| 2007/0166980 | A1 | 7/2007 | Lee et al. |
| 2009/0008621 | A1 | 1/2009 | Lin |

(Continued)

*Primary Examiner* — Samuel Gebremariam
(74) *Attorney, Agent, or Firm* — Well St. John P.S.

(57) ABSTRACT

Some embodiments include semiconductor constructions having an electrically conductive interconnect with an upper surface, and having an electrically conductive structure over the interconnect. The structure includes a horizontal first portion along the upper surface and a non-horizontal second portion joined to the first portion at a corner. The second portion has an upper edge. The upper edge is offset relative to the upper surface of the interconnect so that the upper edge is not directly over said upper surface. Some embodiments include memory arrays.

18 Claims, 5 Drawing Sheets

(56) References Cited

U.S. PATENT DOCUMENTS

2009/0184304 A1    7/2009   Chang et al.
2010/0308296 A1   12/2010   Pirovano et al.
2012/0032136 A1    2/2012   Redaelli et al.
2012/0119370 A1    5/2012   Yoo

* cited by examiner

SEMICONDUCTOR CONSTRUCTIONS AND MEMORY ARRAYS

RELATED PATENT DATA

This patent resulted from a continuation of U.S. patent application Ser. No. 14/323,922, which was filed Jul. 3, 2014, which issued as U.S. Pat. No. 9,490,425, and which is hereby incorporated herein by reference; which resulted from a divisional of U.S. patent application Ser. No. 13/482,672, which was filed May 29, 2012, which issued as U.S. Pat. No. 8,803,118, and which is hereby incorporated herein by reference.

TECHNICAL FIELD

Semiconductor constructions and memory arrays.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information. Some memory utilizes cells which change resistance in transitioning from one memory state to another. Such memory may be referred to as resistive RAM (RRAM).

One type of cell that may be utilized in RRAM is phase change memory (PCM). Such memory utilizes phase change material as programmable material of the memory cell. Example phase change materials that may be utilized in PCM are chalcogenide materials.

Difficulties may be encountered in the fabrication and utilization of memory cells, such as PCM. Accordingly, it is desirable to develop new memory cell architectures. It would also be desirable for aspects of the new architectures to be readily extendible for fabrication of other integrated circuit components, such as, for example, fuses. A fuse is a structure which can be broken down or blown in response to a predetermined current flow to interrupt a circuit.

DETAILED DESCRIPTION OF THE ILLUSTRATED EMBODIMENTS

In some embodiments, the invention includes new architectures comprising electrically conductive structures (for instance, angled plate structures such as L-shaped plates) coupled with electrical interconnects. The conductive structures may be incorporated into any of numerous semiconductor constructions. For instance, in some embodiments the conductive structures may be utilized as heaters in PCM. As another example, in some embodiments the conductive structures may be incorporated into fuses.

In some embodiments, an architecture comprises an angled plate structure over an interconnect, with the angled plate structure having an upper edge which is offset relative to an upper surface of the electrical interconnect so that the upper edge is not directly over the electrical interconnect. Such architecture may have numerous applications in integrated circuitry. For instance, such architecture may be utilized to compensate for possible poor alignment of the angled plate structure relative to the underlying interconnect by providing a larger landing area for the angled plate structure relative to such interconnect. As another example, such architecture may be utilized to compensate for an alternating pitch across multiple interconnects. Specifically, in some embodiments the pitch across the upper edges of a plurality of angled plate structures may be kept approximately constant in spite of an alternating pitch across interconnects electrically coupled with the angled plate structures.

Example embodiments are described below with reference to FIGS. 1-7.

Figure 1:
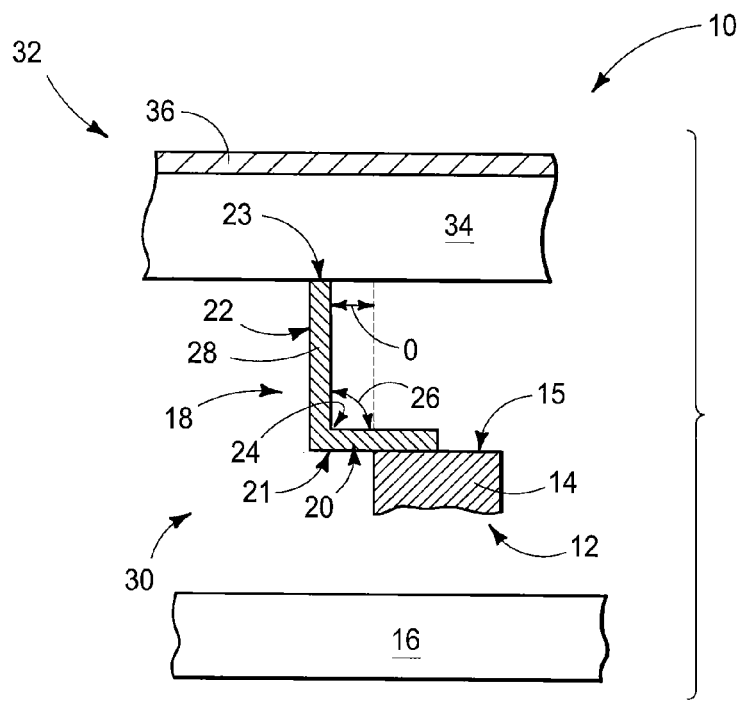
FIG. 1 is a diagrammatic, cross-sectional view of an example embodiment memory cell.

Referring to FIG. 1, an example architecture is described with reference to a semiconductor construction 10. The semiconductor construction includes an electrical interconnect 12. Such interconnect comprises electrically conductive material 14. The material 14 may be any suitable electrically conductive material including, for example, one or more of various metals (for instance, tungsten, titanium, etc.), metal-containing compositions (for instance, metal silicides, metal carbide, etc.) and conductively-doped semiconductor materials (for instance, conductively-doped silicon, conductively-doped germanium, etc.). In some specific examples, the interconnect 12 may be part of, or coupled to, a select device which is utilized to control current through a memory cell. For instance, the interconnect 12 may comprise metal silicide formed over a conductively-doped region of a bipolar junction transistor (BJT). As another example, the interconnect 12 may comprise tungsten which is electrically connected to a diode, transistor, switch, or other suitable select device.

The interconnect 12 may be supported by a base 16 of semiconductor material. Base 16 may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Base 16 may correspond to a semiconductor substrate containing one or more materials associated with integrated circuit fabrication in some embodiments. Such materials may correspond to, for example, one or more of refractory metal materials, barrier materials, diffusion materials, insulator materials, etc. In the shown embodiment, the base is spaced from interconnect 12 to indicate that other materials (not shown) may be provided between the base and the interconnect. In some embodiments, the base may comprise a select device.

The interconnect 12 has an upper surface 15. The interconnect may have any suitable shape. For instance, in some embodiments the interconnect may be cylindrical, and accordingly upper surface 15 may be circular when viewed from above. In other embodiments, upper surface 15 may be elliptical, polygonal, or any other suitable shape when viewed from above. For instance, in some embodiments the interconnect 12 may be a square or rectangular column, and accordingly upper surface 15 may have a square or rectangular shape when viewed from above.

An angled plate structure 18 is over and electrically coupled with the interconnect 12. The angled plate structure comprises a horizontal first portion 20 which is over and along the upper surface 15 of interconnect 12. In the shown embodiment, the first portion 20 has a bottom surface 21 which is directly against a portion of the top surface 15 of interconnect 12.

The angled plate structure has a second portion 22 which joins to the first portion 20 at a corner 24. The corner has an angle 26. In some embodiments, such angle is at least about 90°.

The second portion 22 of angled plate structure 18 is substantially vertical in the shown embodiment and the structure 18 may be considered to be L-shaped; with the horizontal portion 20 of the angled plate structure corresponding to the short leg of the L-shape, and with the vertical portion 22 corresponding to the long leg of the L-shape.

The second portion 22 has an upper edge 23. Such upper edge is offset relative to the upper surface 15 of interconnect 12 so that the upper edge is not directly over the upper surface of the interconnect. In the shown embodiment, the upper edge 23 is offset relative to the upper surface of interconnect 12 by an amount "O". Such amount can be any suitable dimension. For instance, in some embodiments the dimension of "O" may be at least about 5 nanometers, at least about 10 nanometers, etc.

The angled plate structure 18 comprises a material 28. Such material may be the same as material 14 of interconnect 12 in some embodiments, and may be different from the material 14 of interconnect 12 in other embodiments. The material 28 may be any suitable electrically conductive material including, for example, one or more of various metals (for instance, tungsten, titanium, etc.), metal-containing compositions (for instance, metal silicides, metal carbide, etc.) and conductively-doped semiconductor materials (for instance, conductively-doped silicon, conductively-doped germanium, etc.). In some embodiments, the material 28 will comprise a composition suitable for incorporation into a heater of a PCM cell; and accordingly may comprise, for example, a metal nitride (for instance, tungsten nitride, titanium nitride, etc.) or a metal nitride composition (for instance, WCN, TiAlN, TiSiN, etc.).

The angled plate structure 18 may be considered to be an example of a conductive structure formed over the interconnect. In some embodiments, the angled plate structure and the interconnect may be together considered to be a structure/interconnect configuration 30 having an upper edge 23 of the structure 18 offset from an upper surface 15 of the interconnect 12. Such configuration may be utilized in any suitable application. For instance, FIG. 1 shows the configuration 30 incorporated into a memory cell 32. Specifically, programmable material (i.e., memory material) 34 is provided over the edge 23 of angled plate structure 18, and electrically conductive electrode material 36 is provided over the programmable material.

The programmable material may comprise any material suitable for utilization in memory cells. In some embodiments, the programmable material 34 will be phase change material. The phase change material may comprise any suitable composition or combination of compositions, and may, for example, comprise a chalcogenide; such as a composition containing germanium, antimony and tellurium. In some embodiments, the phase change material 34 may be directly against the edge 23 of angled plate structure 18.

The electrode material 36 may comprise any suitable electrically conductive material; and may, for example, comprise one or more of various metals (for instance, tungsten, titanium, etc.), metal-containing compositions (for instance, metal silicides, metal carbide, etc.) and conductively-doped semiconductor materials (for instance, conductively-doped silicon, conductively-doped germanium, etc.).

The material 34 may have two interchangeable states corresponding to different phases of the material adjacent the heater 18. The memory cell 32 may be programmed by utilizing the heater 18 to induce a phase change within a region of material 34 that is adjacent the heater. The memory cell may be read by providing a sufficient voltage differential between interconnect 12 and the electrode material 36 to ascertain resistivity through the memory cell and thereby determine which of the states the memory cell is in. The voltage differential utilized for reading the memory cell may be less than that required to program the memory cell.

The construction 10 of FIG. 1 may be formed with any suitable processing, including, for example, processing analogous to that described in U.S. Patent Publication No. 2010/0308296. In some embodiments, the offset O may be tuned by properly positioning sidewalls of a dielectric material (not shown) so that they are not directly over the interconnect 12. Conductive material 28 may be deposited on the sidewalls and on the upper surface 15 of interconnect 12 and subsequently etched back in a spacer-like process.

The angled plate structure 18 may have any suitable configuration. A few illustrative example embodiment configurations are described with reference to FIGS. 2-4. The angled plate structures and interconnects of FIGS. 2-4 may comprise any of the compositions described above with reference to FIG. 1.

Figure 2:
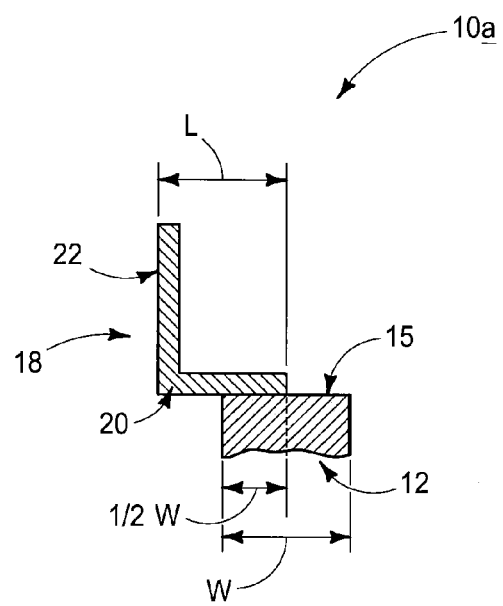
FIGS. 2-4 are diagrammatic, cross-sectional views of example embodiment structures.
Figure 3:
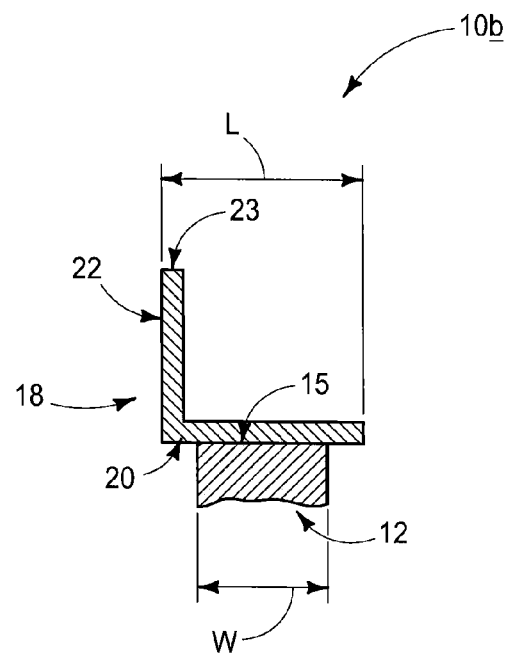

FIG. 2 shows a construction 10a in which the angled plate structure 18 is L-shaped, and in which the horizontal portion 20 of the angled plate structure comprises a length "L". The interconnect 12 is shown to have a width "W" along the cross-section of FIG. 2. In the shown embodiment, the length "L" is greater than one-half of the width (with the dimension of one-half of the width being shown in FIG. 2 as ½ W). Such dimension of length "L" may enable the angled plate structure 18 to be placed in suitable electrical contact with interconnect 12 even if there is substantial misalignment between the processing utilized to form angled plate 18 and the processing utilized to form interconnect 12. FIG. 3 shows a construction 10b in which the length "L" is even more exaggerated to enable greater compensation for potential misalignment of the angled plate structure 18 to the interconnect 12. Specifically, the embodiment of FIG. 3 has the length "L" of the horizontal portion 20 greater than the width "W" of interconnect 12. In the embodiment of FIG. 3, the structure/interconnect contact resistance may be independent of the offset of upper edge 23.

The embodiments of FIGS. 2 and 3 illustrate that the horizontal portion 20 of angled plate structure 18 may be along some or all of the upper surface 15 of interconnect 12. Specifically, FIG. 2 shows the portion 20 of the angled plate structure along a fraction of the upper surface 15 of interconnect 12, and FIG. 3 shows the portion 20 of the angled plate structure along an entirety of the upper surface 15 of the interconnect.

Figure 4:
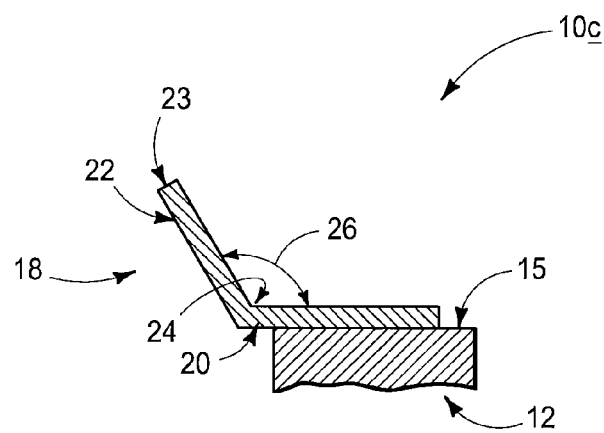

The embodiments of FIGS. 1-3 show the portion 22 of the angled plate structure 18 being substantially vertical. In some embodiments, it may be desired to exaggerate the amount of offset of upper edge 23 (FIG. 1) of the angled plate structure relative to the upper surface of the interconnect 12. In such embodiments, the angle between the portions 20 and 22 may be greater than 90°, as shown in FIG. 4. Specifically, FIG. 4 shows a construction 10c in which the angled plate structure 18 has a corner 24 with an angle 26 of greater than 90°. Such shifts upper edge 23 of the angled plate structure further from over the upper surface 15 of interconnect 12 than would an angle of 90°.

Figure 5:
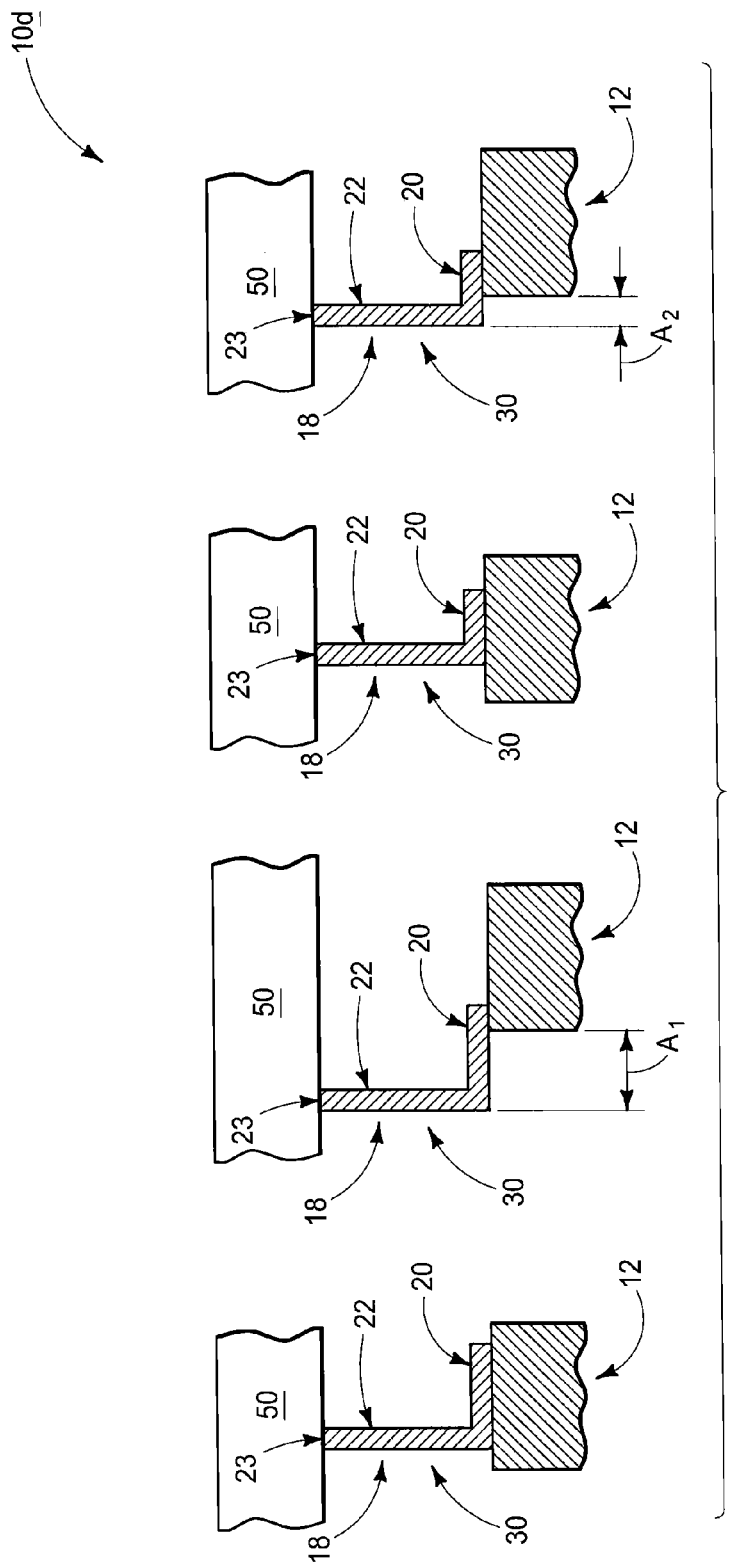
FIG. 5 is a diagrammatic, cross-sectional view of an example embodiment array of structures.

FIG. 5 shows an example embodiment construction 10d having a plurality of electrical interconnects 12, and a plurality of angled plate structures 18 over the interconnects. The angled plate structures and interconnects together form a plurality of structure/interconnect configurations 30. Each of the configurations 30 may be considered to have an angled plate structure paired with an interconnect.

A material 50 is over upper edges 23 of the angled plate structures. In some embodiments, the material 50 may comprise memory material suitable for utilization in RRAM, such as, for example, chalcogenide suitable for incorporation into phase change memory.

The illustrated embodiment shows variation in alignment between angled plate structures 18 and interconnects 12. Specifically, some of the angled plate structures are aligned over the upper surfaces of the interconnects, and others are shifted from alignment relative to such upper surfaces. In the shown embodiment, one of the angled plate structures 18 is shifted from alignment relative to the underlying interconnect 12 by an amount $A_1$ and another is shifted by an amount $A_2$ which is different than $A_1$. However, the sizes of the horizontal portions 20 of the angled plate structures relative to the upper surfaces of the interconnects enables compensation for the misalignment so that all of the angled plate structures form suitable electrical contact to the underlying interconnects.

Although only some of the angled plate structures 18 are shown to be shifted from alignment relative to upper surfaces of interconnects 12, in other embodiments all of the angled plate structures may be offset relative to the underlying interconnects so that all of the configurations 30 have angled plate structures with edges 23 that are not directly over upper surfaces of the underlying interconnects 12. In yet other embodiments, a first plurality of the angled plate structures 30 have a mirror symmetry with respect to a second plurality of angled plate structures (as shown in FIG. 6), and at least one of the pluralities of angled plate structures has edges 23 that are not directly over upper surfaces of the underlying interconnects 12.

Although the embodiment of FIG. 5 shows L-shaped angled plate structures similar to those described above with reference to FIG. 1, in other embodiments other angled plate structures may be utilized. For instance, any of the angled plate structures described above with reference to FIGS. 2-4 may be utilized.

Figure 6:
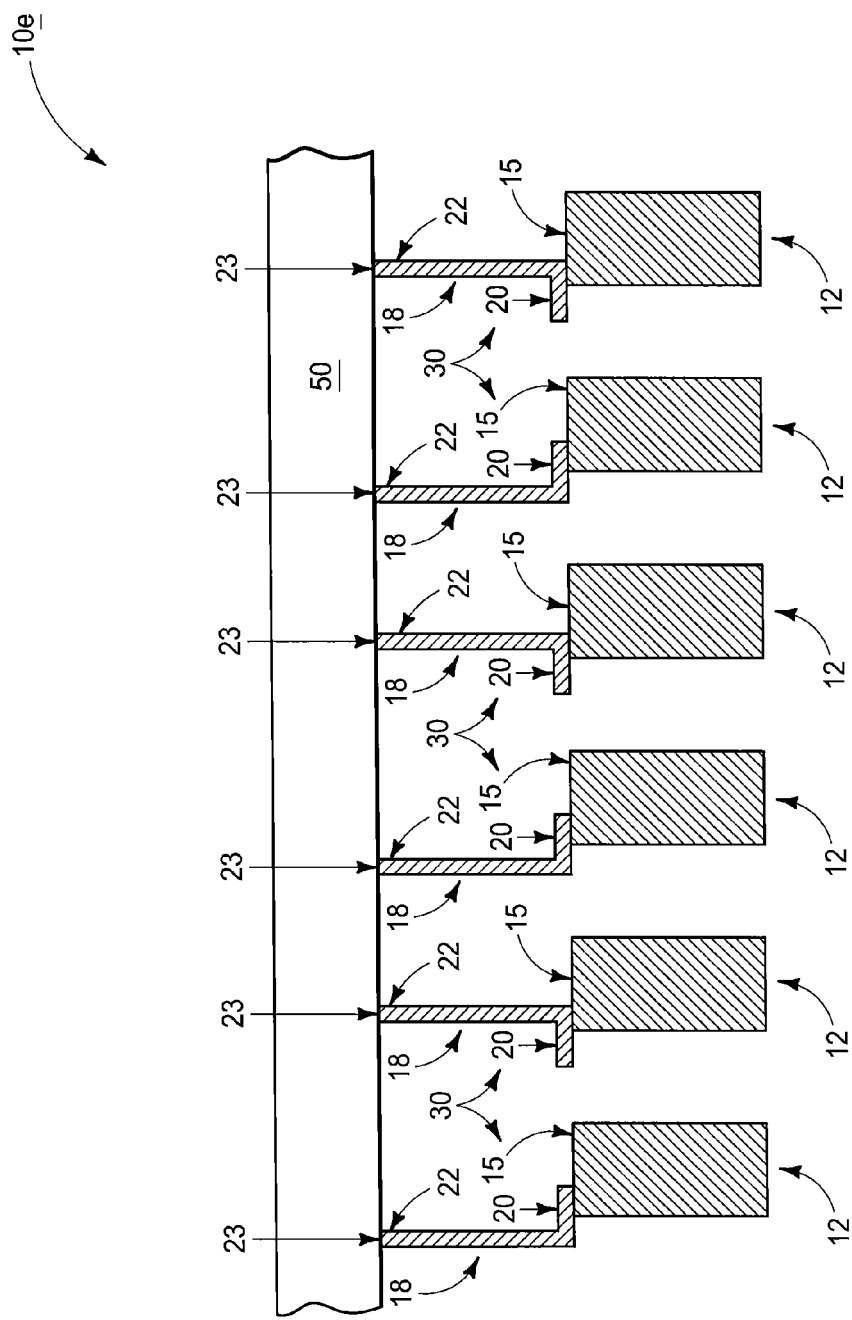
FIG. 6 is a diagrammatic, cross-sectional view of another example embodiment array of structures.

FIG. 6 shows an example embodiment construction 10e having a plurality of electrical interconnects 12, and a plurality of angled plate structures 18 over the interconnects. Identical number is used in FIG. 6 as was utilized above in FIG. 5. The embodiment of FIG. 6 comprises two populations of structures 18; with one population having upper edges 23 directly over upper surfaces 15 of interconnects 12, and the other population having upper edges 23 offset from being directly over such upper surfaces. One of the populations comprises structures 18 which are mirrored along a vertical axis relative to the structures 18 of the other of the populations. In the shown embodiment, each population is about half of the total number of conductive structures 18.

Figure 7:
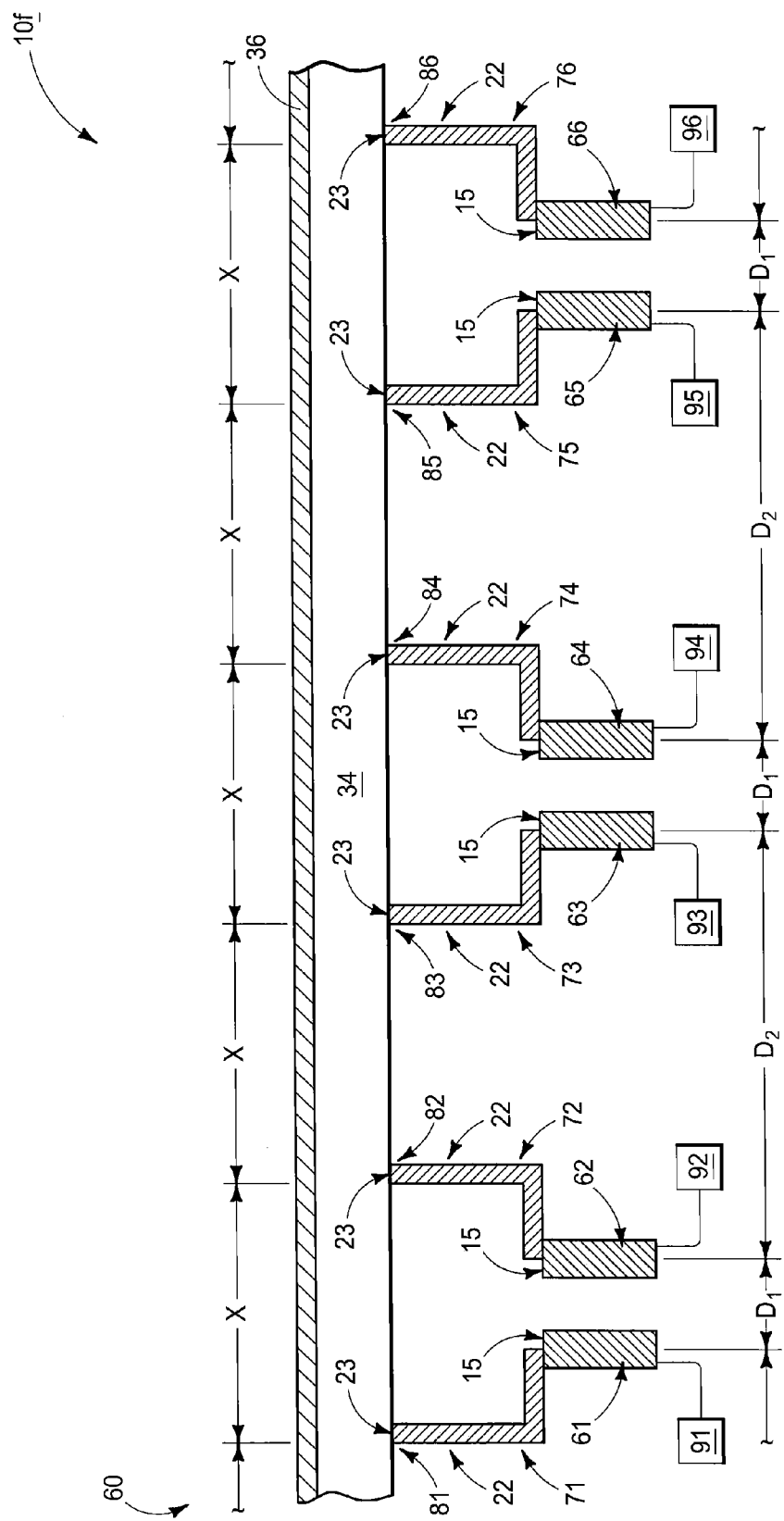
FIG. 7 is a diagrammatic, cross-sectional view of an example embodiment memory array.

FIG. 7 illustrates another example application for configurations in which an upper edge of an angled plate structure is offset relative to a surface of an interconnect underlying the angled plate structure. Specifically, FIG. 7 shows a construction 10f comprising a portion of a memory array 60.

The memory array comprises a plurality of interconnects 61-66. Such interconnects may comprise any of the materials described above with reference to interconnect 12 of FIG. 1. The interconnects are spaced from one another by alternating large and small gaps along the cross-section of FIG. 7. Specifically, some adjacent interconnects are spaced from one another by small gaps $D_1$ and others are spaced from one another by the large gaps $D_2$. The alternating spacings of the interconnects may result from the fabrication process utilized to form the interconnects. For instance, various pitch-multiplication methodologies may create alternating spacings within materials patterned through such methodologies. In some embodiments, $D_2$ may be at least about 10-times $D_1$, at least about 6-times $D_1$, at least about triple $D_1$, at least about double $D_1$, etc.

The interconnects 61-66 have upper surfaces 15. Angled plate structures 71-76 are formed over and directly against the upper surfaces of the interconnects 61-66, respectively. Such angled plate structures may comprise any of the compositions discussed above with reference to the angled plate structure 18 of FIG. 1. In some embodiments, there may be additional materials (not shown), such as barriers, etc., between the angled plate structures and the upper surfaces of the interconnects.

The angled plate structures have upper edges 23, and are arranged over interconnects 61-66 so that the upper edges 23 are spaced from one another by a consistent dimension "X" which is intermediate $D_1$ and $D_2$. Thus, the angled plate structures are utilized to transition from the alternating pitch of the interconnects to a consistent pitch. In some embodiments, $D_1$ and $D_2$ may be referred to as small and large gaps, respectively; and in such embodiments "X" may be considered to be a dimension of third gaps; with such dimension of the third gaps being intermediate the dimensions of the small and large gaps.

In another embodiment (not shown) the upper edges 23 may be spaced from one another by second alternating large and small gaps, both with dimension that is intermediate between the large and small gaps between the interconnects, (for instance, the $D_2/D_1$ ratio may be reduced to approach about 1). In such embodiments, the second small gap may have a dimension larger than a dimension of the small gap between the interconnects, and the second large gap may have a dimension smaller than a dimension of the large gap between the interconnects.

In some embodiments, the memory array of FIG. 7 may be considered to comprise a first plurality (or population) of angled plate structures (71, 73, 75) and a second plurality (or population) of angled plate structures (72, 74, 76) adjacent to the angled plate structures of the first plurality and mirror-symmetric to them. Respective second portions 22 of the angled plate structures in the first plurality and in the second plurality are shown to be offset in an opposite direction so as to make the spacing of respective upper edges 23 more uniform across the array.

Memory material 34 is formed across the upper edges 23 of the angled plate structures, and electrode material 36 is formed across the memory material. Regions of the memory material over the edges 23 of angled plate structures 71-76 are incorporated into memory cells 81-86. The memory array 60 may comprise any of numerous types of memory cells (for instance, various types of a RRAM cells), and the memory material 34 may be any material suitable for utilization in such memory cells. For instance, the memory material 34 may be chalcogenide material suitable for utilization in PCM cells in some embodiments.

The interconnects 61-66 are shown to be connected to underlying circuitry 91-96. Such circuitry may be utilized for programming and/or reading of memory cells 81-86.

Although the embodiment of FIG. 7 shows L-shaped angled plate structures similar to those described above with reference to FIG. 1, in other embodiments other angled plate structures may be utilized. For instance, any of the angled plate structures described above with reference to FIGS. 2-4 may be utilized.

The configurations comprising angled plate structures and interconnects may be utilized in other applications besides memory cells. For instance, the configurations may be utilized to form fuses. In such applications, a region where a bottom surface of the angled plate structure joins a top surface of an interconnect (for instance, the region where bottom surface 21 joins top surface 15 in FIG. 1) may be configured to rupture when sufficient voltage is provided across such interface. In such embodiments, the interconnect may comprise tungsten and the angled plate structure may comprise titanium nitride doped with one or more of silicon, aluminum and carbon. The amount of current suitable to rupture the interface between the interconnect and the angled plate structure may be tailored, to some extent, through the selection of dopant concentration and type provided within the titanium nitride. In some embodiments, the rupture of the interface may occur through a mechanism utilizing electron wind. Specifically, current flow through the interface causes electro-migration wherein momentum of moving electrons causes atoms to move from their original positions, and ultimately causes formation of a void. The mechanism is provided herein to assist the reader in understanding some embodiments, and is not to limit the invention except to the extent, if any, that such mechanism is expressly recited in the claims that follow.

The electronic devices and memory arrays described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present. A structure is "directly over" a surface if the structure is vertically aligned relative to the surface. A structure may be "over" a surface, but not "directly over" the surface if the structure is above the surface and offset relative to vertical alignment with such surface.

In some embodiments, a semiconductor construction comprises an electrically conductive interconnect having an upper surface, and comprises an electrically conductive structure over the interconnect. The structure has a horizontal first portion and has a non-horizontal second portion joined to the first portion at a corner. At least some of the first portion is along the upper surface. The second portion has an upper edge. The upper edge is offset relative to the upper surface of the interconnect so that the upper edge is not directly over the upper surface.

In some embodiments, a semiconductor construction comprises a plurality of electrically conductive interconnects having upper surfaces, and a plurality of electrically conductive structures over the interconnects. The electrically conductive structures are paired with the interconnects to form structure/interconnect configurations. The electrically conductive structures have horizontal first portions joining to second portions at corners of about 90°. The horizontal first portions comprise regions along upper surfaces of the interconnects. The second portions have upper edges. At least one of the configurations comprises an electrically conductive structure upper edge which is offset relative to an interconnect upper surface so that the upper edge is not directly over the upper surface paired with the upper edge.

In some embodiments, a memory array comprises a plurality of electrically conductive interconnects having upper surfaces. The interconnects are spaced from one another by alternating large and small gaps along a cross-section. Angled plate structures are over the interconnects. The angled plate structures have horizontal first portions joining to second portions. The horizontal first portions comprise regions along upper surfaces of the interconnects. The second portions have upper edges that are offset relative to the upper surfaces of the interconnects so that the upper edges are not directly over the upper surfaces. The upper edges are spaced from one another by third gaps along the cross-section. The third gaps are intermediate in dimension relative to the large and small gaps along the cross-section. Memory material is over the upper edges of the angled plate structures.

In some embodiments, a memory array comprises a plurality of electrically conductive interconnects having upper surfaces. The interconnects are spaced from one another by alternating large and small gaps along a cross-section. The memory array also comprises angled plate structures over the interconnects. The angled plate structures have horizontal first portions joining to second portions. The horizontal first portions are along upper surfaces of the interconnects. The second portions have upper edges that are offset relative to the upper surfaces of the interconnects so that the upper edges are not directly over the upper surfaces. The upper edges are spaced from one another by a consistent dimension along the cross-section. Memory material is directly against the upper edges of the angled plate structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
conductive interconnects having upper surfaces;
conductive structures over the conductive interconnects; the conductive structures being paired with the conductive interconnects to form structure/interconnect configurations; the conductive structures having horizontal first portions joining to non-horizontal second portions at corners of about 90°; the horizontal first portions comprising regions along upper surfaces of the conductive interconnects; the non-horizontal second portions having upper edges above the horizontal first portions; and
at least one of the structure/interconnect configurations comprising the upper edge of the non-horizontal second portion laterally offset relative to the upper surface of the conductive interconnect so that the upper edge of the non-horizontal second portion of said at least one structure/interconnect configuration is not directly over the upper surface of the conductive interconnect of said at least one structure/interconnect configuration.

2. The construction of claim 1 wherein the conductive structures are comprised by two populations, with one of the populations having the upper edges of the non-horizontal second portions directly over upper surfaces of the conductive interconnects, and the other of the populations having the upper edges of the non-horizontal second portions not directly over upper surfaces of the conductive interconnects.

3. The construction of claim 1 wherein the conductive structures comprise different material from the conductive interconnects.

4. The construction of claim 1 wherein the upper edges of the non-horizontal second portions are not directly over the upper surfaces of the conductive interconnects.

5. The construction of claim 1 wherein the conductive structures comprise titanium.

6. The construction of claim 1 wherein the conductive structures comprise titanium and nitrogen.

7. The construction of claim 1 wherein the conductive interconnects comprise one or both of tungsten and silicon.

8. A memory array, comprising:
a plurality of electrically conductive interconnects having upper surfaces, the interconnects being spaced from one another by alternating large and small gaps along a cross-section;
angled plate structures over the interconnects; the angled plate structures having horizontal first portions joining to second portions; the horizontal first portions comprising regions along upper surfaces of the interconnects, the second portions having upper edges that are offset relative to the upper surfaces of the interconnects so that the upper edges are not directly over the upper surfaces; wherein the upper edges are spaced from one another by a same dimension along the cross-section; and
memory material directly against the upper edges of the angled plate structures.

9. The memory array of claim 8 wherein the angled plate structures comprise different material than the interconnects.

10. The memory array of claim 8 wherein the angled plate structures comprise titanium; wherein the interconnects comprises one or both of tungsten and silicon; and wherein the memory material comprises germanium, antimony and tellurium.

11. The memory array of claim 8 wherein the angled plate structures have angles of at least about 90° between the first and second portions.

12. The memory array of claim 8 wherein the angled plate structures are L-shaped plates, with the horizontal first portions being short legs of the L-shapes and the second portions being long vertical legs of the L-shapes.

13. The memory array of claim 8 wherein the upper surfaces have widths along a cross-section, and wherein the horizontal first portions are across entireties of said widths.

14. The memory array of claim 8 wherein the upper surfaces have widths along a cross-section, and wherein the horizontal first portions are not across entireties of said widths.

15. The memory array of claim 8 wherein the memory material is chalcogenide material.

16. The memory array of claim 8 in which the angled plate structures comprise a first population and a second population; the second portions of the angled plate structures of the first population being offset in an opposite direction relative to the second portions of the angled plate structures of the second population.

17. The memory array of claim 16 wherein the memory material comprises chalcogenide.

18. The memory array of claim 16 wherein the memory material comprises germanium, antimony and tellurium.

* * * * *